United States Patent [19]
Finger et al.

[11] 4,377,849
[45] Mar. 22, 1983

[54] MACRO ASSEMBLER PROCESS FOR AUTOMATED CIRCUIT DESIGN

[75] Inventors: Wesley C. Finger, Saugerties, N.Y.; Gerald B. Long, Austin, Tex.

[73] Assignee: International Business Machines Corporation, Armonk, N.Y.

[21] Appl. No.: 221,150

[22] Filed: Dec. 29, 1980

[51] Int. Cl.³ .............................................. G06F 15/46
[52] U.S. Cl. .................................. 364/491; 364/300; 307/303
[58] Field of Search ....................... 364/491, 300, 200; 307/303; 357/59

[56] References Cited

U.S. PATENT DOCUMENTS

| | | | |
|---|---|---|---|
| T938,005 | 9/1975 | Colton et al. | 444/1 |
| T940020 | 11/1975 | Brechling et al. | 444/1 |
| 3,475,621 | 10/1969 | Weinberger | 307/215 |
| 3,567,914 | 3/1971 | Neese et al. | 235/151.1 |
| 3,653,071 | 3/1972 | Hill et al. | 444/1 |
| 3,653,071 | 3/1972 | Hill et al. | 364/491 X |
| 3,968,478 | 7/1976 | Mensch, Jr. | 364/491 X |

OTHER PUBLICATIONS

The Automatic Design of Interconnection Patterns for Large Scale Integration; P. E. Radley; International Conference on Computer Aided Design, Apr. 15–18, 1969.
Producing Integrated Circuits from a Circuit Logic Input; O. Bilous, et al, IBM Technical Disclosure Bulletin, vol. 13, No. 5, Oct. 1970, pp. 1084–1089.
Relating Logic Design to Physical Geometry in LSI Chip; K. W. Lallier & A. D. Savkar, IBM Technical Disclosure Bulletin, vol. 19, No. 6, Nov. 1976, pp. 2140–2143.
Incremental Masterslice Part Number Design; B. C. Fox & W. R. Kraft; IBM Technical Disclosure Bulletin, vol. 20, No. 3, Aug. 1977, pp. 1116–1119.

*Primary Examiner*—Edward J. Wise
*Attorney, Agent, or Firm*—John W. Henderson, Jr.

[57] ABSTRACT

A process automatically generating topology data for fabricating large scale integrated circuits. Technology data, a logic function description and logic circuit components are generated and input to a data processing system together with geometric dimension data descriptive of the basic elements of the logic circuit components. The geometric dimension data is assembled into a plurality of intermediate level geometric topology patterns under control of the logic function description and the intermediate level geometric topology patterns are assembled into a prime level geometric topology representative of the logic function description. The logic circuit components are merged with the prime level geometric topology to produce a grid array to be fabricated into a large scale integrated circuit.

4 Claims, 20 Drawing Figures

FIG. 1

| INPUTS | OUTPUTS | | | | |
|--------|---|---|---|---|---|
| A B C | 1 | 2 | 3 | ··· | m |
| 1 1 1 | 1 | 1 | | | |
| 1 0 | | 1 | | | |
| 1 1 | | | | | 1 |
| 1 1 | | 1 | | | 1 |

PRODUCT TERM 1
PRODUCT TERM 2
PRODUCT TERM 3
PRODUCT TERM 4

BOOLEAN EQUATIONS FOR ABOVE TABLE:
$$OUT1 = A \cdot B \cdot C$$
$$OUT2 = (A \cdot \overline{C}) + (A \cdot \overline{B})$$
$$OUT3 = A \cdot B \cdot C$$
$$OUTm = (A \cdot B) + (A \cdot \overline{C})$$

SUPER-SLICE SHADOW

I/O  ARRAY  I/O

FIG. 10

SUBSLICES $S_1$
$S_2$
$S_3$

I/O  ARRAY  I/O

X DENOTES LOCATION OF LOGIC CONNECTIONS

MACRO ASSEMBLER PROCESS FOR AUTOMATED CIRCUIT DESIGN

BACKGROUND OF THE INVENTION

1. Field of the Invention

This invention relates to design automation systems are methods and particularly to an enhanced method for preparing data for processing semiconductors.

2. Description of the Prior Art

Since the advent of large scale integrated circuits (LSI), it has become possible to fabricate many thousands of circuits on a single semiconductor wafer or chip. Proportional to the number of LSI circuits that may be fabricated on a single semiconductor chip is the complexity of the procedure for arranging such circuits for proper interconnection and isolation. This complexity has necessitated the creation of computer aided automatic design systems.

Typical of prior art directed to automatic circuit design systems are U.S. Pat. Nos. 3,475,621 issued Oct. 28, 1969 to A. Weinberger, 3,567,914 issued Mar. 2, 1971 to J. L. Neese, et al, and Defensive Publication T940,020 published Nov. 4, 1975 by G. E. Brechling, et al. These prior art systems typically disclosed techniques for devising orthogonal coordinates and using these coordinates to provide interconnect points for logical elements in the circuits to be fabricated. The techniques are sometimes referred to as cellular logic design and the logic elements are referred to as "cells". Data describing the logic elements, the orthogonal coordinates, and the interconnect points for the logical elements are input to a data processing unit and a circuit generation program operates the data processing unit to provide interconnection between the circuit elements or cells. However, these prior art systems are limited in the complexity of the circuits that can be fabricated using them because each requires a specification of all possible logic cells used with all possible interconnect points between the cells to enable fabrication of the logic function in a single pass. For example, a two-input NAND gate has 12 possible input and output wiring pattern combinations allowing only for vertical and horizontal wiring with fixed input and output locations. With the prior art systems, data describing each of these possible NAND gate configurations as a complete entity must be stored in the system. Each configuration is considered a cell. In addition to the input and output wiring configurations, multiple power levels could be needed for the technology. If two power options were available, the number of cells required increases to 24. The NAND gate may be used in combination with other basic logic cells, for example OR, AND, NOR, and NOT. Each of these circuits requires a separate configuration, adding to the multiplicity of cells. This limits prior art techniques to relatively simple construction or to very specific implementation of more complex structures, for example the high density logic array disclosed in U.S. Pat. No. 3,987,287 issued Oct. 19, 1976 to Cox, et al. Furthermore, using the prior art techniques produces a circuit pattern that is not conducive to modification. Any change in any of the cells in the circuit requires a totally new circuit to be produced.

SUMMARY OF THE INVENTION

It is an object of the present invention to provide a process for generating complex circuits which minimizes the number of unique logic cells required.

It is another object of this present invention to provide a process for generating complex circuits that is flexible and susceptible to modification.

These and other objects are accomplished by providing a multi-pass process for generating complex circuits. The process provides a generalized marco structure for assembling complex logic functions. The logic cells are broken down into the basic components of the logic technology. For example a logic gate such as a NAND is broken down into the logic circuit, possible wiring patterns and possible power levels. Each of these is placed into a different basic cell and the logic cell is generated by selecting and assembling the basic cells into a level cell. Other logic cells, for example AND, OR, NOR, NOT, are assembled by combining the same basic cell elements into level cells. The level cells are assembled into prime cells or macros to complete the circuit design. The process is made flexible because new logic cells or changes in logic cells may be accomplished by modifying the basic cell elements. The process is generalized by defining outlines or "shadows" of the basic cells based on the geometry of the cell. The shadows are then assembled into the macro cell structure. The logic circuit elements are merged with the macro cell structure of the shadows to produce the complete macro circuit.

DESCRIPTION OF THE PREFERRED EMBODIMENT

Figure 1:
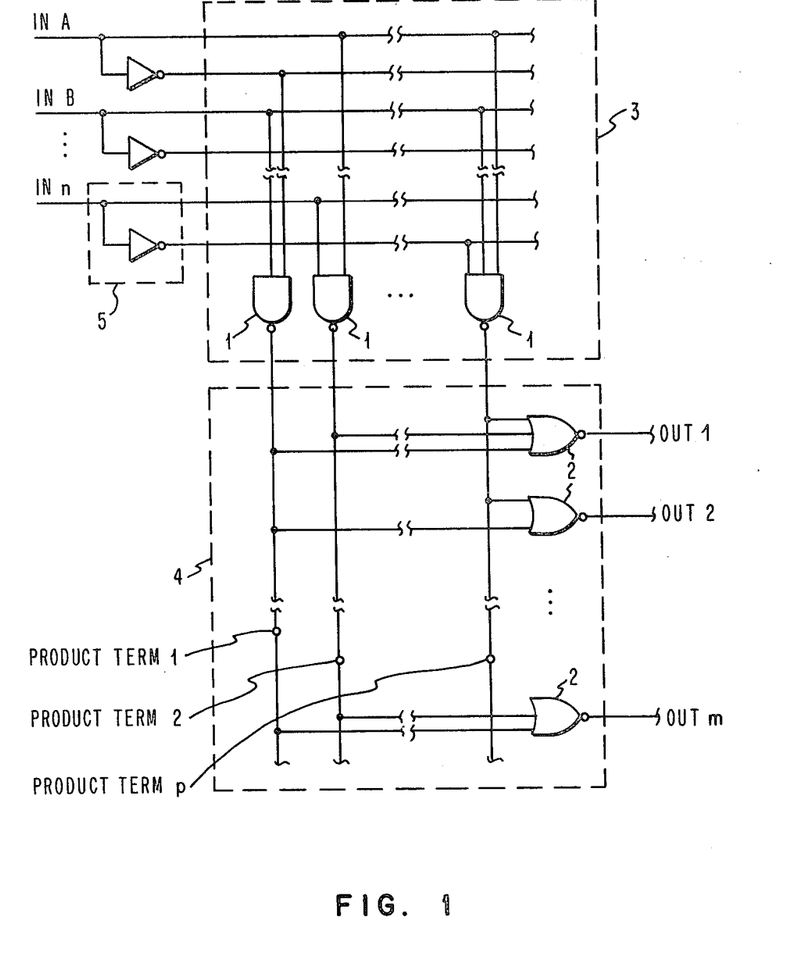
FIG. 1 is a simplified schematic of a portion of a programmable logic array.

Referring now to FIG. 1 there is shown a simplified schematic drawing of a section of a typical programmable logic array (PLA). An example of such a PLA is disclosed in U.S. Pat. No. 3,987,287 issued Oct. 19, 1976, to Dennis T. Cox, et al. The PLA comprises a string of AND gates 1 and OR gates 2 custom configured to produce a specified output given a specified input. The inputs typically run across one dimension of the AND array 3 and the AND circuits 1 traverse the other direction. The AND circuits 1 and called PRODUCT TERMS. The logic function of the AND array 3 is determined by the presence or absence of gates at the intersection of the input lines and the PRODUCT TERMS.

The array 4 of OR gates 2 is developed in a like fashion. The PRODUCT TERMS traverse one direction of the OR array 4 and the outputs traverse the other direction. Again, the presence or absence of gates at the intersections determine the function performed.

Logic design using PLA's is typically done by writing Boolean equations. The general equation for the PLA shown in FIG. 1 can be written as follows:

$$OUT1 = f_1(ABC \ldots n) + f_2(ABC \ldots n) + f_p(ABC \ldots n)$$
$$OUT2 = f_1(ABC \ldots n) + f_2(ABC \ldots n) + f_p(ABC \ldots n)$$
$$\vdots$$
$$OUTm = f_1(ABC \ldots n) + f_2(ABC \ldots n) + f_p(ABC \ldots n)$$

For each function expression $F_{k(ABC \ldots n)}$ is a Boolean AND of some combination of ABC . . . n.

Figure 2:
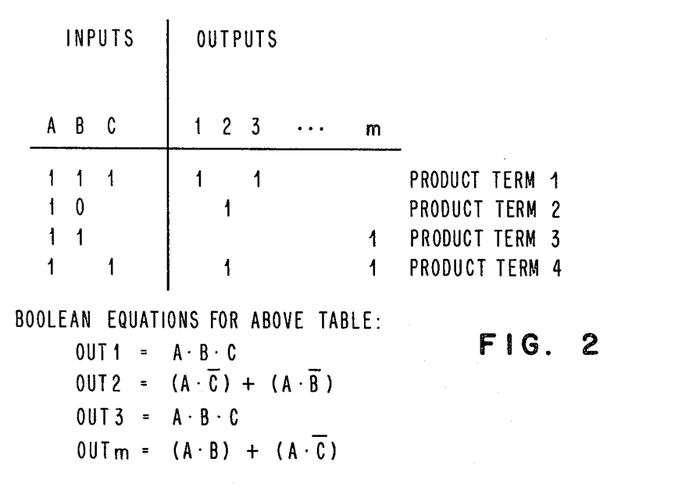
FIG. 2 is a truth table representation of an exampled of the Boolean functions that can be performed by the programmable logic array of FIG. 1.

A second way to represent the function of a PLA is through the use of a truth table as shown in FIG. 2. The Boolean equivalent is shown at the bottom of the figure. The positions in the table that do not have an entry are "don't care" positions. Note the introduction of a zero in the truth table. This is implemented by supplying both a signal and its complement to the AND array 3 through an input circuit 5. This requires two lines across the AND 3 array for each input variable. This brief description of the makeup of a PLA is intended only as introductory, further detail being already familiar to those skilled in the art.

Figure 4:
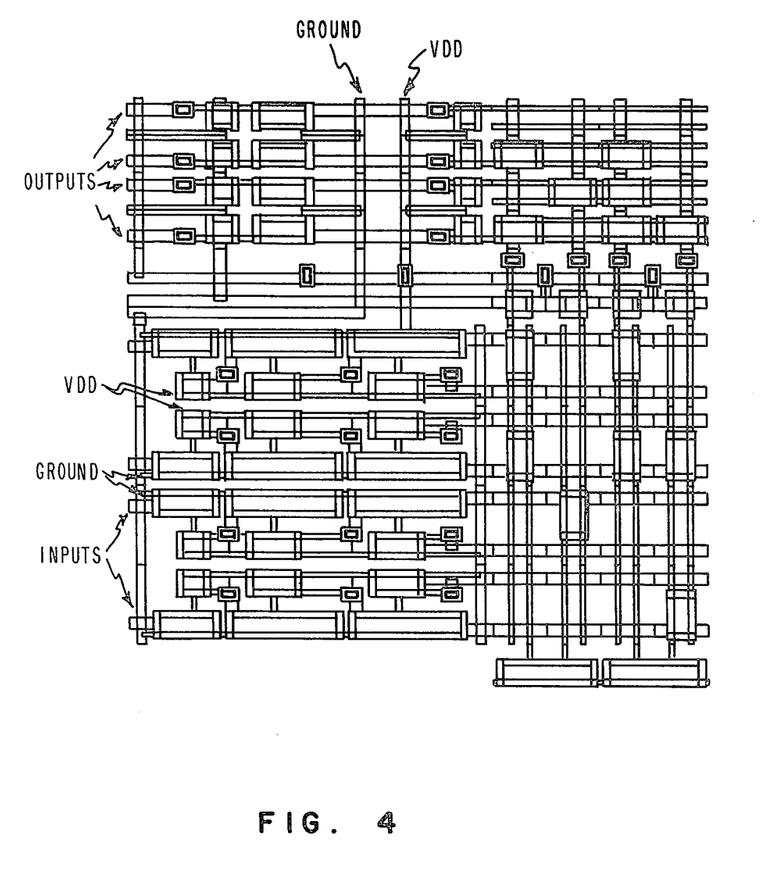
FIG. 4 is a graphical representation of an assembled macro for a programmable logic array.

Referring now to FIG. 4 there is shown an example of an assembled circuit or macro for a programmable logic array. Macro as used herein refers to the concept that a complete circuit is composed of a plurality of different circuit elements or cells. The circuit elements or cells are divided into three categories. These categories are the basic cell, the level cell and the prime cell. Basic cells are nested together to form level cells and level cells are nested together to form a prime cell. The prime cell represents a complete macro. This arrangement is shown conceptually in FIG. 8.

Figure 5:
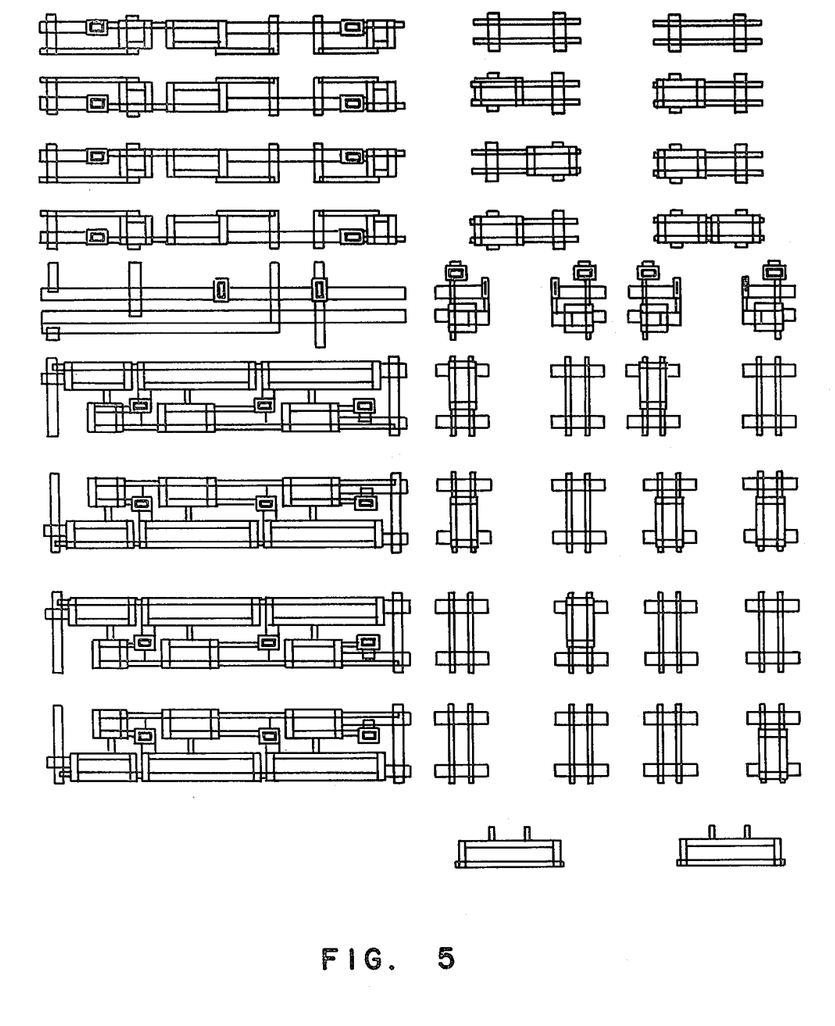
FIG. 5 is a representation of the array of FIG. 4 broken into basic cells.
Figure 6:
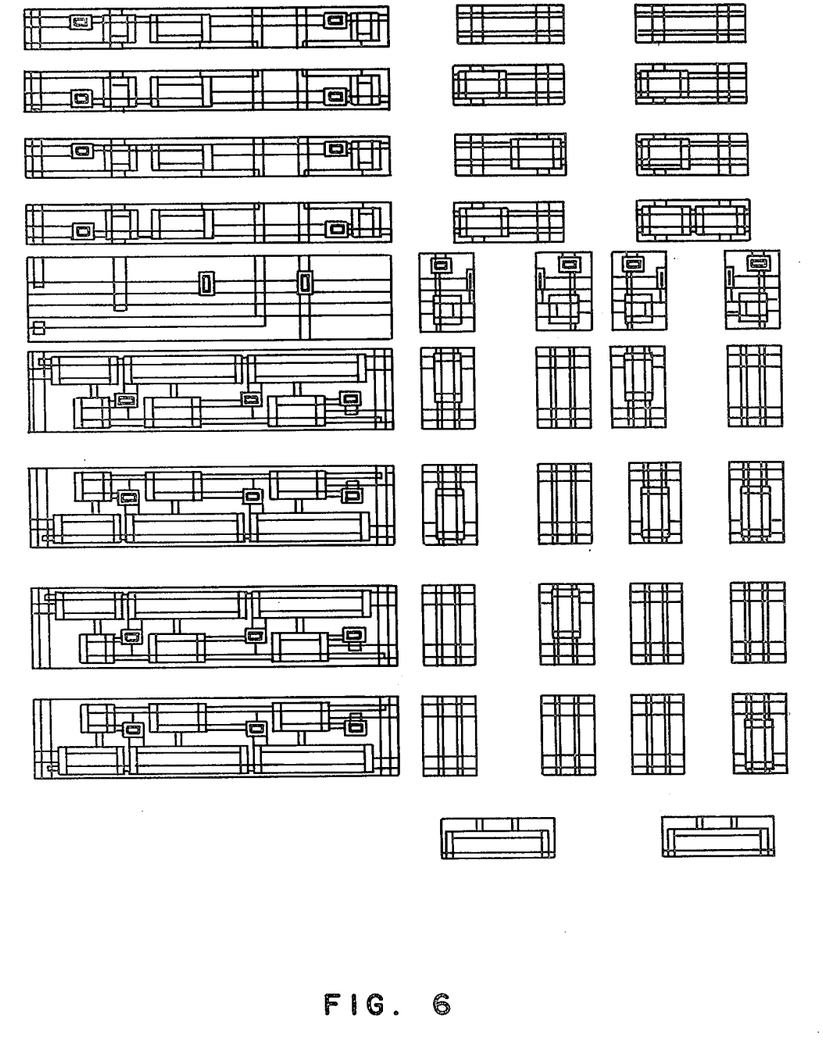
FIG. 6 is a representation of the array of FIG. 5 with the basic cells enclosed in shadows.

Basic cells are the basic circuit elements for the technology being used. The basic cells may be categorized as I/O basic cells and array basic cells. For example in a programmable logic array the basic cells consist of a combination of AND gates, OR gates and input gates as previously discussed with reference to FIG. 1. The macro in FIG. 4 is shown broken into basic cells in FIG. 5. It will be noted that each of the basic cells has a geometric shape which is definable by a rectangular enclosure. FIG. 6 shows the basic cells of FIG. 5 including a rectangular enclosure drawn around each cell. The rectangular enclosure placed around a basic cell is referred to as a shadow.

Figure 7:
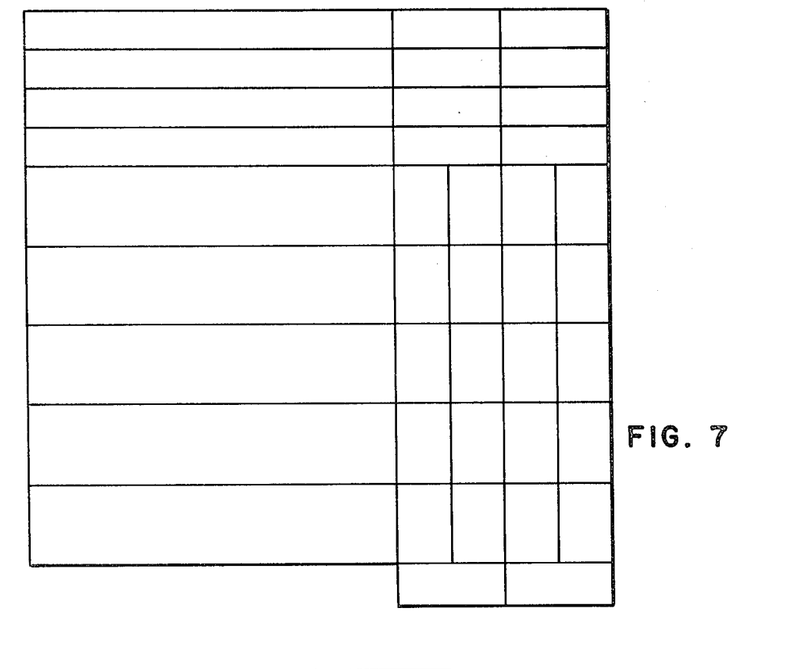
FIG. 7 is a representation of the array of FIG. 4 showing only the shadows.

The shadows for the basic cells define the amount of area that must be reserved for each basic cell in the macro. The size of the basic cell's shadow is referred to as the basic cell's periodicity. Assuming a rectangular coordinate system is used to define the macro, each basic cell has an X periodicity an a Y periodicity. The X periodicity is the width of the basic cell's shadow and the Y periodicity is the height of the basic cell's shadow. The basic cells' shadows contain all the physical information that is necessary to create macro structures. Therefore, the shapes of the basic cells may be removed leaving only the shadow of the basic cell. FIG. 7 shows the macro of FIG. 4 as an assemblage of basic cell shadows.

Figure 3:
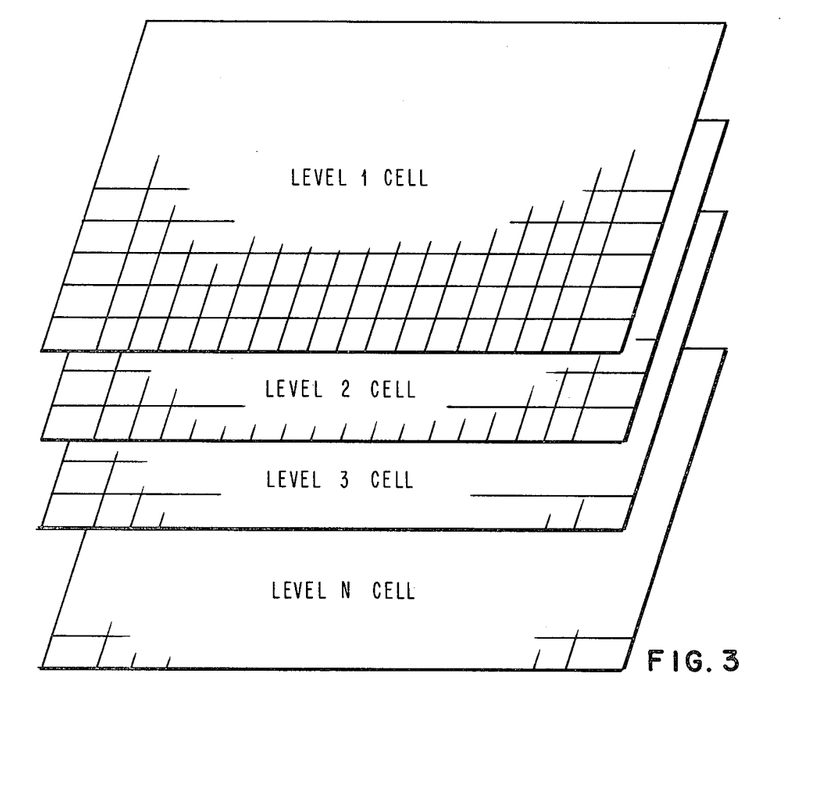
FIG. 3 is a three dimensional shadow representation of a macro prime cell.
Figure 8:
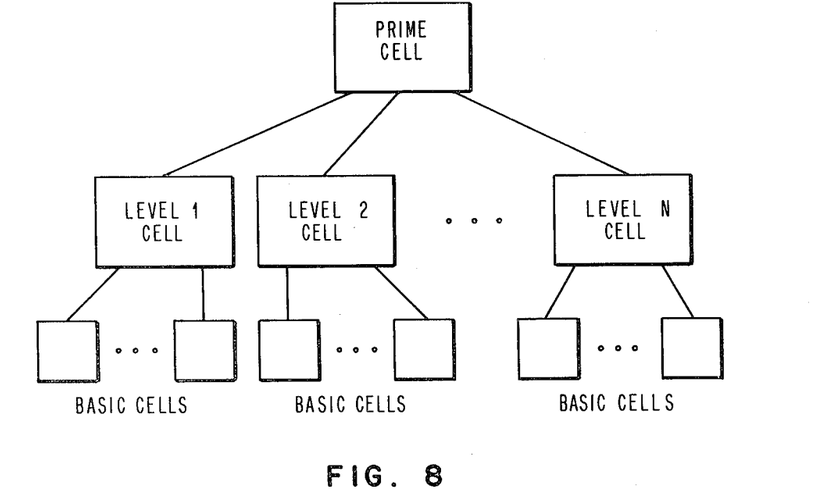
FIG. 8 is a hierarchial representation of the macro design structure.

As previously stated in reference to FIG. 8, macros are created by nesting basic cells into level cells which, in turn, are nested into the prime cell. The prime cell consists of a number of level cells structured one on top of the other as shown in FIG. 3 and is a complete macro.

Figure 9:
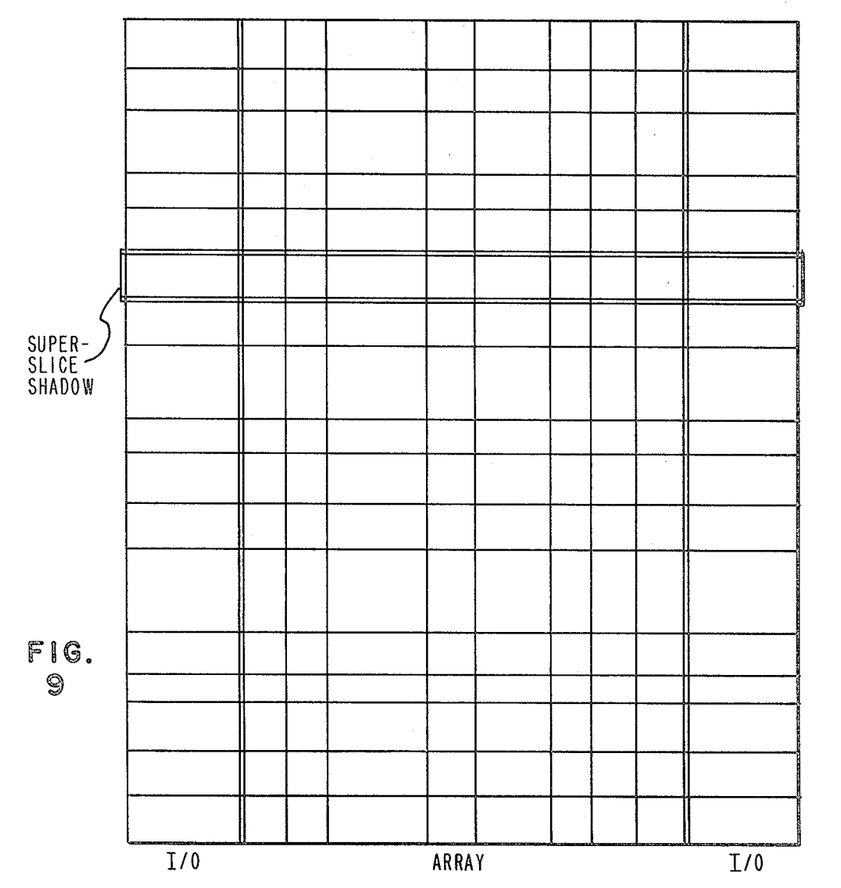
FIG. 9 is a representation of a single level of cell shadows.
Figure 10:
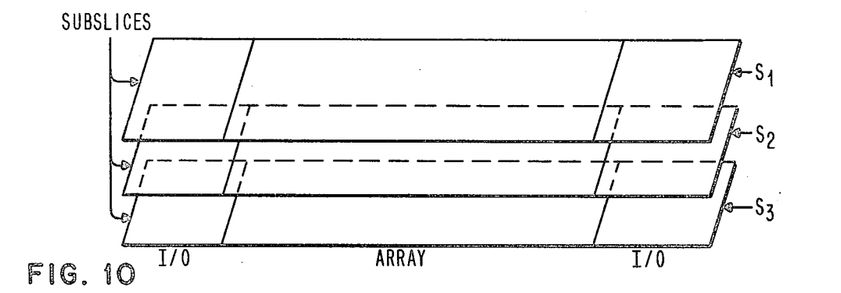
FIG. 10 is a three dimensional representation of a typical superslice shadow of FIG. 9.

Each level cell consists of an array of basic cells. The array structure, in shadow form, is shown in FIG. 9. The leftmost and rightmost columns are I/O columns. These columns will comprise I/O basic cells. The remaining columns are reserved for array basic cells. By changing the orientation of the prime cell when it is placed on a chip, the I/O cells can be moved from a column to a row. Each physical row in the array of basic cells for a level is a subslice. Subslices for the level cells are stacked one on top of the other in the same physical area in the prime cell and make up a superslice. Each subslice may contain up to two I/O basic cells and a row of array basic cells. It is valid for a subslice to contain I/O basic cells only and no array basic cells or vice versa. FIG. 10 shows a three-dimensional view of a superslice that contains three subslices. The number of subslices contained in a superslice is independent of the number of levels in the prime cell or macro.

The periodicity of each row and each column in a level can be different. Further, each subslice may have a different number of array cells within a given level. The structure shown in FIG. 9 for a level cell is not required in its entirety for all macro types. Only those columns needed in a particular macro type need be used.

A key aspect of this technique is its ability to reduce the total number of basic cells required to support any given macro type. For example in the case of a particular PLA implementation that uses folding, the number of cells typically required to support the PLA AND and OR arrays using a single level approach will be derived and then compared to the number of cells required using the present technique.

Figure 16:
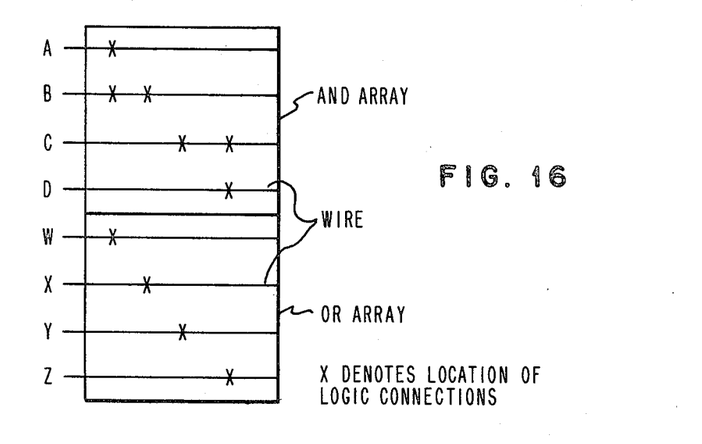
FIG. 16 is a representation of the wiring pattern for a typical PLA.

Folding is used here to mean the technique of combining two wires in one of the PLA arrays that in the unfolded form require an entire column or row each. FIG. 16 shows the horizontal wiring pattern for a PLA with all inputs and outputs on the left side of the macro only.

Figure 17:
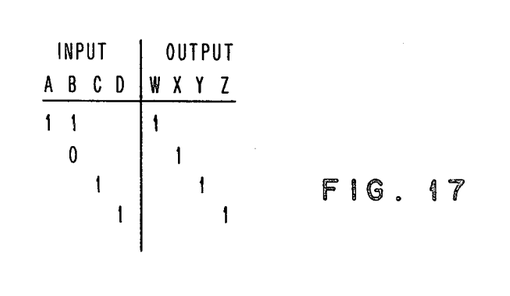
FIG. 17 is a truth table for the PLA of FIG. 16.
Figure 18:
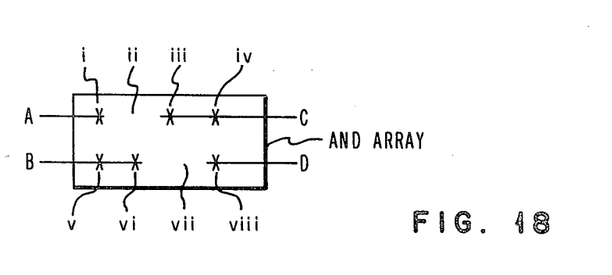
FIG. 18 shows the PLA of FIG. 16 with the inputs folded.

FIG. 17 shows the personality (truth table for the macro). By allowing inputs and outputs to be on both sides of the macro, it is possible to share columns, i.e., fold the cells in macro. FIG. 18 shows the inputs of the AND array of FIG. 16 folded. Note that folding requires breaking the wires between the cells.

An analysis of the number of cells required to implement the AND array in FIG. 16 is determined by establishing how many different functions are possible in any given array position.

If the AND array cell positions are numbered as shown in FIG. 18, the function of each cell is as follows:

| Cell # | Logic | Horizontal Wire Function |
|--------|-------|--------------------------|
| i      | 1     | terminate on right (TR)  |
| ii     | .     | No Wire (NH)             |
| iii    | 0     | terminate on left (TL)   |
| iv     | .     | thru (TH)                |
| v      | 1     | thru (TH)                |
| vi     | 0     | terminate on right (TR)  |
| vii    | .     | No Wire (NH)             |
| viii   | 1     | terminate on left (TL)   |

Each cell performs a different function. This example does not use all the possible combinations. In fact, every logic function (1, ., 0) can be used with practically every wire function (TR, TL, TH, NH) resulting in the total number of potential cell required being the product of the two.

TN = # Logic Function × # horizontal wire function =

$$3 \times 4 = 12$$

Vertical wires could also be involved in folding. This results in a third function that must be incorporated into the basic cells. If the same four wire functions were required in the vertical direction, i.e., terminate TOP (TT), terminate Bottom (TB), No Wire (NV), thru (TV), this would multiply the number of cells again by 4 or:

Total number of cells = No. Logic functions ×
  No. horizontal wire functions ×
  No. vertical wire functions = 3 × 4 × 4 = 48 cells.

The total number of cells is related to the PRODUCT of the number of different functions; in this case, logic, horizontal wire and vertical wire.

By using the multi-pass (level) approach with each function being implemented entirely within a single level and then combining the levels to produce the complete AND array, the number of cells reduces to the following:

| Level           | Cells Required | # Cell/Level |
|-----------------|----------------|--------------|
| Logic           | .              | 3            |
|                 | 1              |              |
|                 | 0              |              |
| Horizontal Wire | TR             | 4            |
|                 | TL             |              |
|                 | TH             |              |
|                 | NH             |              |
| Vertical Wire   | TT             | 4            |
|                 | TB             |              |
|                 | NV             |              |
|                 | TV             |              |

The total number of cells for the complete AND array is the SUM of the cells required for each level cell.

Total # Cells = No. Cell Logic Level +
  No. cell horizontal wire level +
  No. cells vertical wire level = 3 + 4 + 4 = 11 cells.

As can be seen from this description, the design of large scale integrated circuits becomes technology independent utilizing the macro assembler process. The product designer need only specify the cell type and shadow and these shadows may then be nested together to perform a complete macro for the circuit design. Once the macro assembly is complete, the shadows can be replaced by the basic cell elements for fabrication of the device.

Figure 11:
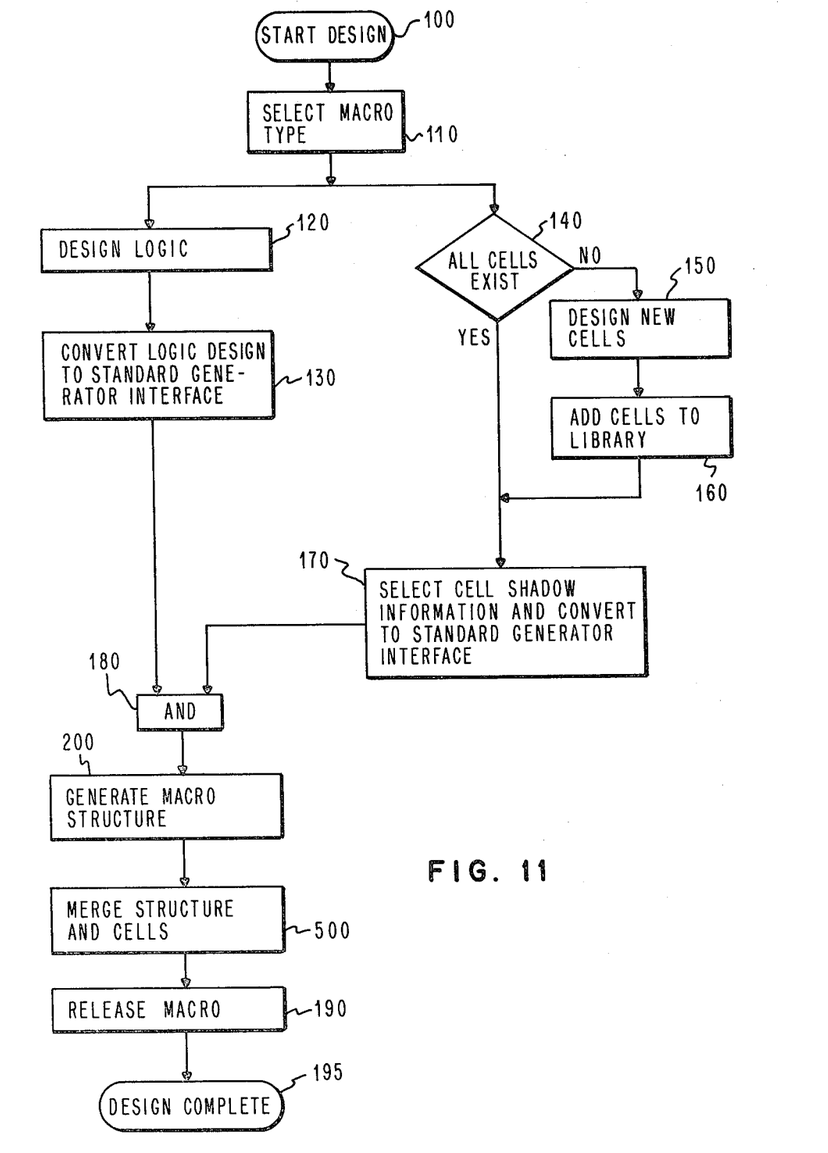
FIG. 11 is an overall flow diagram for the macro assembler process.

Referring now to FIG. 11 there is shown a logical flow diagram of the macro assembler process. The process begins at block 100. At logical block 110 a selection of the macro type is initiated. The macro type refers to the type of circuit design or technology, for example, PLA's or registers. The data description of the various macro types would normally be stored in the memory of a data processing system and interactively accessed by an operator using a terminal such as the IBM 3270. At logic block 140 a check is made to determine if the cells for the selected macro exist in the storage banks of the data processing system. If the cells do not already exist in the system storage, then new cells must be designed at block 150 and entered into the system storage library at block 160. Concurrently with the cell design, the logic function to be implemented in the macro must be designed at block 120. This logic function is designed by a logic designer in the form of Boolean equations, or truth tables, or some other similar technique. At block 170 the cell shadow information, i.e., the periodicity information for each cell is selected from the memory and converted to a standard generator interface for the macro structure. At block 130 the logic design information is also converted to the standard generator interface. The standard generator interface is a generalized design language used to relate the shadow data representative of the logic cells to the real data describing the logic functions to be implemented from the design logic block 120. The logic design information and the cell shadow information are combined at AND 180 and input to the generate macro structure function at logic block 200.

Figure 12:
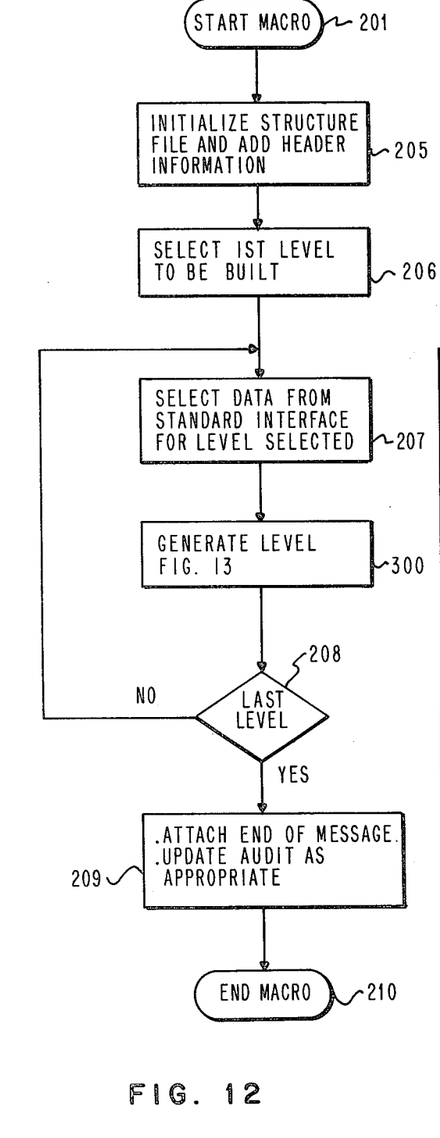
FIG. 12 is flow diagram for the generate macro structure function of FIG. 11.

FIG. 12 shows a detailed operation of the generate macro structure function of logic block 200. The function begins at logic block 201 and enters logic block 205 where the structure file is initialized and then has the header information added to it. The header information is record keeping information such as the macro name, time and data, scale of measurement units, and other physical messages including level names and cell names. At logic block 206 the first level to be built is selected from the level names. At logic block 207 the output from the standard interface which includes the cell shadow information from logic block 170 and logic structure information from logic block 130 are selected for the level and output to the level generator at logic block 300.

Figure 13:
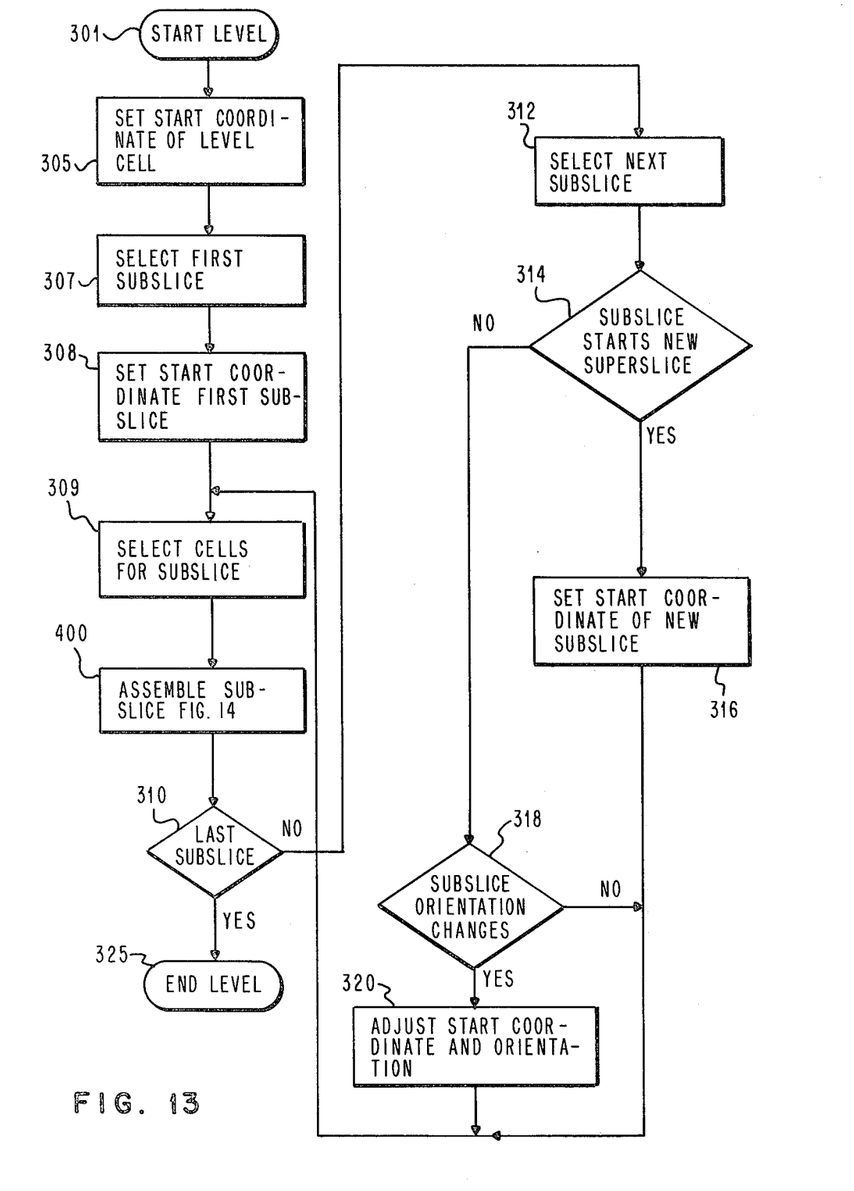
FIG. 13 is a flow diagram for the generate level function of FIG. 12.

Details of the level generator 300 are shown in FIG. 13. The routine is entered at logic block 301 and at logic block 305 the start coordinate, the X, Y position, for the level cell is set. At logic block 307 the first subslice is selected. At logic block 308 the start coordinate for the subslice is set. This start coordinate may differ from the start coordinate for the level if the slice is to be rotated or mirrored (turned upside down) with respect to the start coordinate for the level. At logic block 309 the cell shadows for the subslice are selected and input to the assemble subslice routine at logic block 400.

Figure 14A:
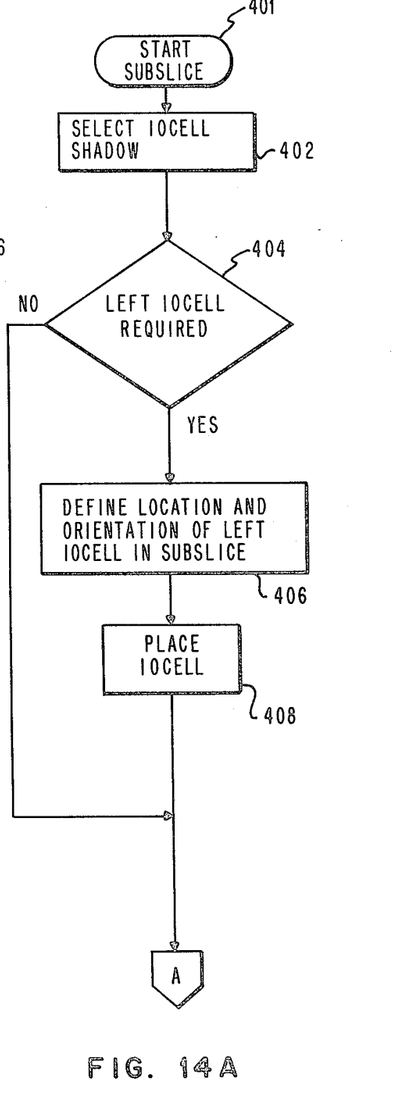
FIG. 14 is a flow diagram for the assemble slice function of FIG. 13.
Figure 14B:
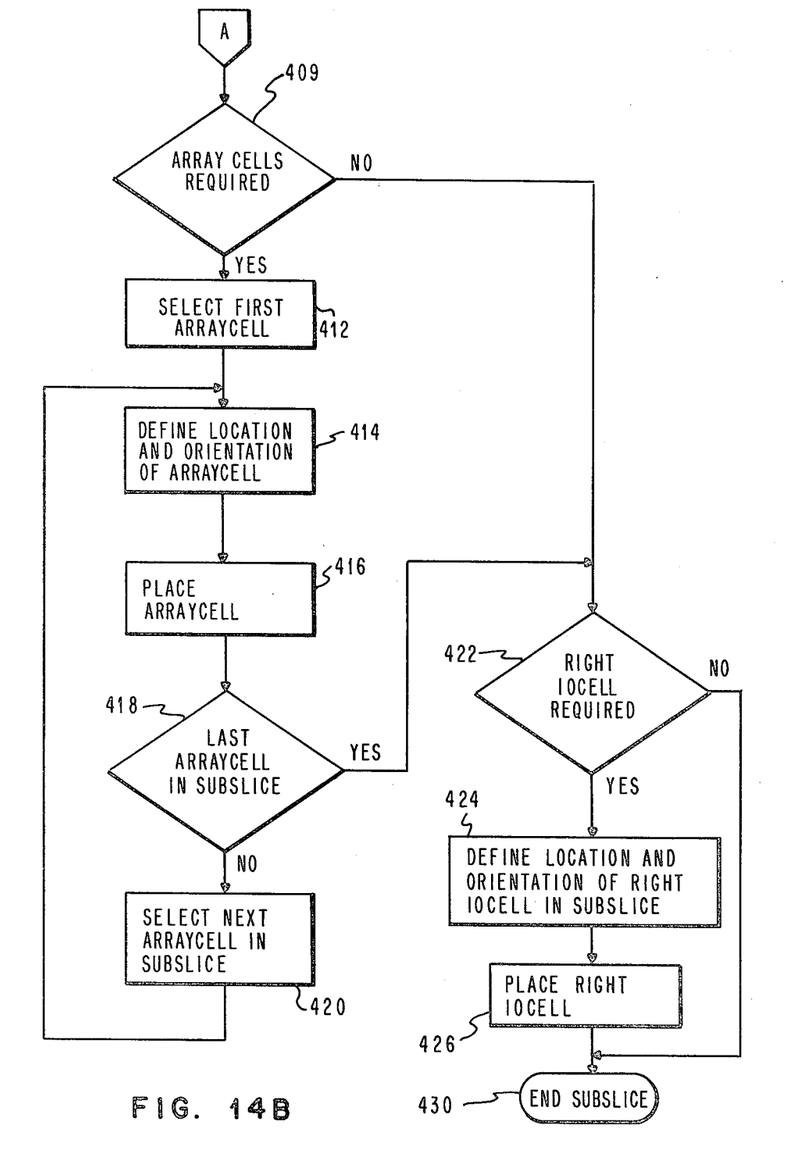

The detail logical flow for the assemble subslice routine 400 is shown in FIG. 14. The routine is entered at logic block 401 and at logic block 402 the I/O cell shadow for the subslice is selected. At logical block 404 a test is conducted in accordance with the requirements of the logic design function 120 of FIG. 11 to determine if the I/O cell is required for the left end of the subslice. If yes, at logic block 406, the location and orientation of the left I/O cell is determined from the requirements in the logic design function 120 of FIG. 11. At logic block 408 the data information for the I/O cell is placed in the physical data for the subslice which includes the origin of the cell and mirror and rotate specifications. At logic block 409 a test is conducted in accordance with the requirements of logic design function 120 to determine if array cells are required. If yes, the first array cell for the subslice is selected at logic block 412. At logic block 414 the location and orientation of the array cell with respect to the subslice as a function of the I/O cell and array cells already placed is defined. At block 416 the array cell is placed into the subslice. At logic block 418 a test is conducted to determine if the array was the last array cell in the subslice. If not, at logic block 420 the next array cell is selected and a branch is taken back to logic block 414 to continue adding array cells in the slice. When the last array cell has been added, a branch is taken to logic block 422 where a test is conducted in accordance with the requirements of logic function 120 to determine if a right I/O cell is required for the subslice. If no right I/O cell is required, a branch is taken to logic block 430 to end the subslice. If a right I/O cell is required, then at 424, the location and orientation of the right I/O cell for the subslice are defined and at logic block 426 the right I/O cell is placed in the subslice. The subslice is then ended at logic block 430.

Referring back to FIG. 13 following the assembly of the subslice, a test is conducted at logic block 310 to determine if the just completed subslice was the last subslice for the level. If not then the next subslice is selected at logic block 312 and a test is conducted at logic block 314 to determine if the next subslice starts a new superslice. If yes, then start coordinates for the new subslice are set at logic block 316 and a branch is taken back to logic block 309 to select the cells for the new subslice and assemble the subslice at logic block 400. If no new superslice is began, then at logic block 318, a test is conducted to determine if the next subslice orientation should change from the previous subslice. If not, a branch is taken back to logic block 309 and processing continues as previously described. If the next subslice orientation does change from the previous subslice, then at logic block 320 the start coordinate and orientation for the new slice is adjusted and then processing returns to logic block 309 for assembly of the new subslice. When the last subslice has been constructed for the level then the level ends at logic block 325 and processing returns to FIG. 12, logic block 208, where a test is conducted to determine if the just completed level was the last level for the macro. When the test at logical block 208 indicates that the completed level was not the last level for the macro then a branch is taken back to logic block 207 and data is selected for the next level and processing continues to generate the next level at logic block 300 as described above. When the last level has been generated, then at logic block 209 an end of message signal is generated and appropriate header information is generated or updated (for example, audits, time date stamp). The macro then ends at 210. This provides a return to logic block 500 in FIG. 11.

Figures 15A, 15B:
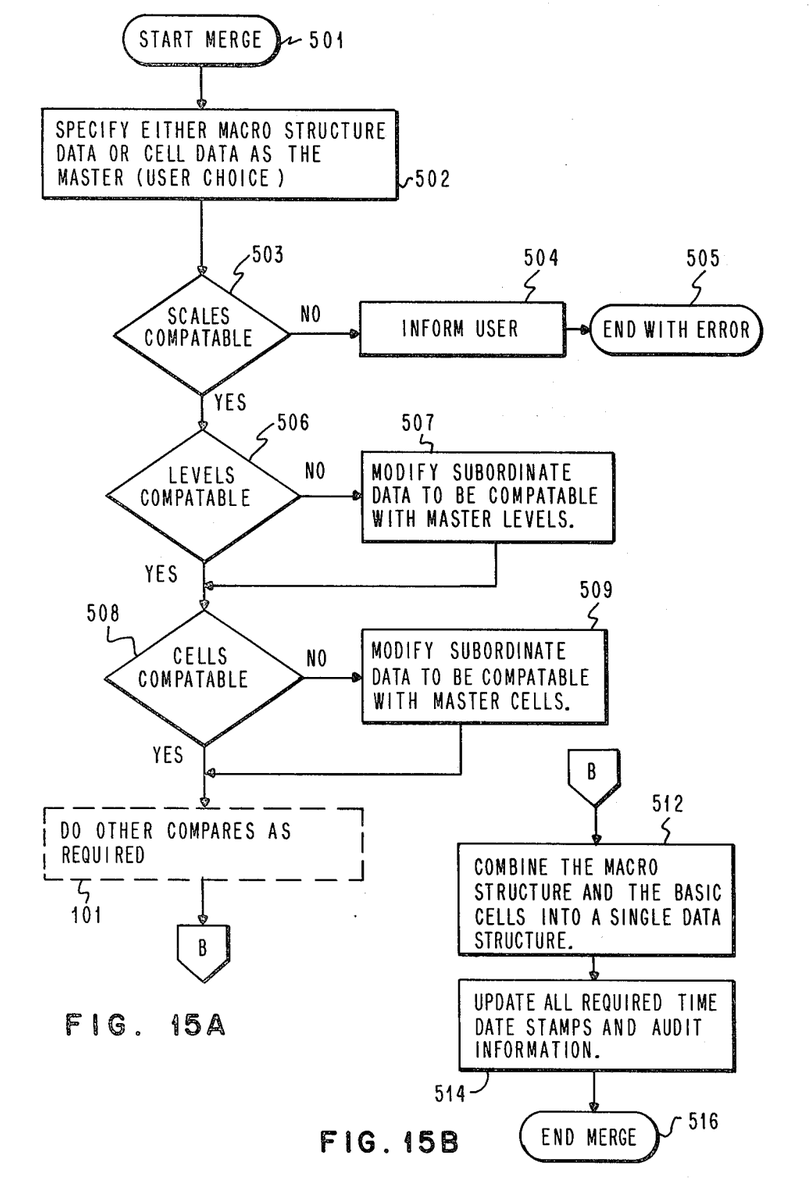
FIG. 15 is a flow diagram of the merge structure and cell functions of FIG. 11.

Referring now to FIG. 11, logic block 500, a merge operation is provided to join the logic structure to the shadow cells. The detail flow diagram for the this function is shown in FIG. 15. At logic block 502 the user has the option to designate either the macro shadow structure data or the logic cell data as the master for the merge function. The master provides a standard against which the other subordinate structure is tested for compatibility. At logic block 503 the unit measurement scales of the two data sets are compared for compatibility. If the scales are not compatible, then at block 504 a message is presented to the user and the process ends with an error at logic block 505.

When the scales are compatible, a branch is taken to logic block 506 wherein the levels for the two sets are compared for compatibility. If the levels are not compatible, then at logic block 507 the subordinate data set is modified to be compatible with the selected master level and a branch is taken to logic block 508. At logic block 508 the cells are tested for compatibility. If the cells are not compatible then at logic block 509 the subordinate data is again modified to be compatible with the cells of the selected master data. Logic block 101 is inserted in dotted line form to give the option to enter other compares that may be desired for the particular technology being utilized.

At logic block 512 the macro shadow structure and the basic logic cells are combined into a single data structure. At logic block 514 the output of logic block 512 is updated with the time and date stamp and other audit information as previously described and the merge operation ends at logic block 516 with a return to 190 where the macro is ready for release. The generated macro may then be output in any of various forms including a photolithographic mask for etching a circuit design. The design process ends at logic block 195.

While the invention has been particularly shown and described with reference to a preferred embodiment thereof, it will be understood by those skilled in the art that various changes in form and detail may be made therein without departing from the spirit and scope of the invention.

What is claimed is:

1. A multipass process for automatically generating topologies for fabricating large scale integrated circuits comprising the steps of:
   (a) inputting electrical and functional data relative to the logic technology used;
   (b) calculating a logical map of the desired logic function;
   (c) designing a plurality logic cells representative of functional logic components;
   (d) dividing said plurality of logic cells into a plurality of basic cell components having a plurality of common elements;
   (e) selecting said basic cell components in accordance with the calculated logical map of the desired logic function;
   (f) concatenating the selected basic cell components into a plurality of intermediate level cells representing components of the desired logic function, and (g) concatenating said plurality of intermediate cells into a prime cell representing desired logic function.

2. The process of claim 1 further including the steps of designing a plurality of basic geometric outlines representing topologies of said basic cell components, selecting and concatenating said basic geometric outlines into a plurality of intermediate level geometric outlines, concatenating said plurality of intermediate geometric outlines into a prime geometric outline and merging said prime geometric outline and said basic cell components into a prime cell representing the desired logic function.

3. The process of claim 1 or claim 2 wherein the step of selecting and concatenating includes the step of assigning each basic cell a coordinate location within said topology.

4. The process of claim 1 or claim 2 wherein said steps of dividing said plurality of logic cells includes dividing each logic cell into logic circuit, vertical wiring, horizontal wiring, and power wiring components and retaining only one set of components common to multiple logic cells.

* * * * *